United States Patent

Bui

[11] Patent Number: 6,147,513
[45] Date of Patent: Nov. 14, 2000

[54] METHOD AND CIRCUIT FOR LOGIC INPUT BUFFER

[75] Inventor: John Henry Bui, San Jose, Calif.

[73] Assignee: Winbond Electronics Corporation, Hsinchu, Taiwan

[21] Appl. No.: 09/071,673

[22] Filed: May 1, 1998

[51] Int. Cl.[7] .............................................. H03K 19/0175
[52] U.S. Cl. .................................. 326/83; 326/87; 326/86
[58] Field of Search .................................. 326/83, 86, 87, 326/27; 327/387

[56] References Cited

U.S. PATENT DOCUMENTS

| | | | |
|---|---|---|---|
| 5,495,187 | 2/1996 | Martin | 326/33 |
| 5,732,027 | 3/1998 | Arcoleo et al. | 365/189.05 |
| 5,801,548 | 9/1998 | Lee et al. | 326/31 |

*Primary Examiner*—Michael Tokar
*Assistant Examiner*—Anh Tran
*Attorney, Agent, or Firm*—Townsend & Townsend & Crew LLP

[57] ABSTRACT

A novel logic input buffer having independent DC input trip points (e.g., $V_{IL}$ and $V_{IH}$), reduced cross current during signal transitions, shorter propagation delay, and improved noise performance. The input buffer includes a set of input transistors having dynamically adjustable beta(s) that allows for robust control of the transistor(s) operating characteristics. The beta(s) can be adjusted by changing the size(s) of the input transistors through enabling and disabling selected one(s) of additional input transistor(s).

32 Claims, 6 Drawing Sheets

METHOD AND CIRCUIT FOR LOGIC INPUT BUFFER

BACKGROUND OF THE INVENTION

This invention relates generally to a digital logic circuit. More particularly, it related to a logic input buffer and related circuitry.

Digital logic circuits are used for various electronic applications such as microprocessors, controllers, digital signal processors, memory devices, etc. Digital logic circuits can be classified into three popular logic families: (1) transistor-transistor logic (TTL), (2) emitter-coupled logic (ECL), and complementary metal-oxide-semiconductor (CMOS). CMOS logic circuits offer advantages over other logic families because of its low dissipation power, compact design, and noise immunity.

For a digital logic circuit, each input signal is typically provided to an input logic buffer within the logic circuit. A simplified schematic of a generic CMOS inverting input buffer 100 is shown in FIG. 1A. The input buffer 100 has two input transistors, a P-channel transistor 112 and an N-channel transistor 114, coupled in series. The input transistors 112 and 114 are MOS enhancement mode devices. The source of the upper P-channel transistor 112 couples to an upper power supply (VDD) and the source of the lower N-channel transistor 114 couples to a lower power supply (VSS). The gates of both transistors couple together and comprise the input of the buffer 100. The drains of both transistors couple together and comprise the output of the buffer 100.

A set of considerations is taken into account in the design of the input buffer 100. These considerations include: (1) DC specifications, (2) noise margin, (3) noise immunity, (4) cross current, (5) circuit size, (6) switching speed, and so on. Digital logic circuits are characterized, in part, by their DC specifications. The DC specifications include: (1) the logic high input voltage threshold $V_{IH}$, (2) the logic low input voltage threshold $V_{IL}$, (3) the logic high output voltage $V_{OH}$, and (4) the logic low output voltage $V_{OL}$. Generally, an input signal having a voltage above $V_{IH}$ is considered a logic high input and a voltage below $V_{IL}$ is considered a logic low input. The $V_{IH}$ and $V_{IL}$ are the input "trip" points at which the logic circuit changes state. An output signal is above $V_{OH}$ volts for a logic high output and below $V_{OL}$ volts for a logic low output.

Usually, by varying the betas of the transistors, the designer can alter the characteristics of the circuit to affect one or more of the above considerations. Generally, the circuit designer selects the betas of the transistors (e.g., the betas of the P-channel transistor 112 and the N-channel transistor 114) and the ratio of the transistor betas, such that the most favorable characteristics are obtained. The betas, in turn, can be controlled by proper sizing of the transistors. Because the degree of control is limited for the number of considerations, a suboptimal circuit design is typically produced.

SUMMARY OF THE INVENTION

The present invention provides a novel logic input buffer having one or more of the following benefits: (1) independent DC input trip points (e.g., $V_{IL}$ and $V_{IH}$), (2) reduced cross current during signal transitions, (3) faster switching time, (4) shorter propagation delay, and (5) improved noise performance. The input buffer includes a set of input transistors having dynamically adjustable beta(s) that allows for robust control of the transistor(s) operating characteristics. The beta(s) can be adjusted by changing the size(s) of the input transistors through enabling and disabling selected one(s) of additional input transistor(s).

In one embodiment, the input buffer includes a pair of MOS input transistors, a P-channel transistor and an N-channel transistor, coupled in series and to respective supply sources. One additional P-channel input transistor is coupled in series with a control transistor, the combination of which is coupled in parallel with the P-channel input transistor. The additional input transistor is selectively enabled, through the control transistor, during either the rising or falling transition of the input signal, depending on the desired operating characteristics. The additional input transistor provides the benefits described above.

In another embodiment, the input buffer includes a pair of MOS input transistors coupled as in the above embodiment. One additional N-channel input transistor is coupled in series with a control transistor, the combination of which is coupled in parallel with the N-channel input transistor. The additional input transistor is selectively enabled to provide many benefits described below.

In yet another embodiment, the input buffer includes a pair of MOS input transistors coupled as in the first embodiment. Two additional input transistors, one P-channel and one N-channel, are provided. Each additional input transistor couples in series with a control transistor, the combination of which is coupled in parallel with the similar channel type input transistor. The additional input transistors are selectively enabled to provide the benefits described below.

Additional embodiments can be designed using the inventive concept described herein. Furthermore, one or more "enable" transistors can be provided to activate and deactivate the input buffer.

A control circuit is used to generate the control signal to enable or disable the additional input transistor(s). The control circuit can be designed to accept the input signal Vin to, or the output signal Vout from, the input buffer to which the control circuit couples.

For a further understanding of the nature and advantages of the invention, reference should be made to the ensuing detailed description taken in conjunction with the accompanying drawings.

DETAILED DESCRIPTION OF THE INVENTION

Figure 2A:
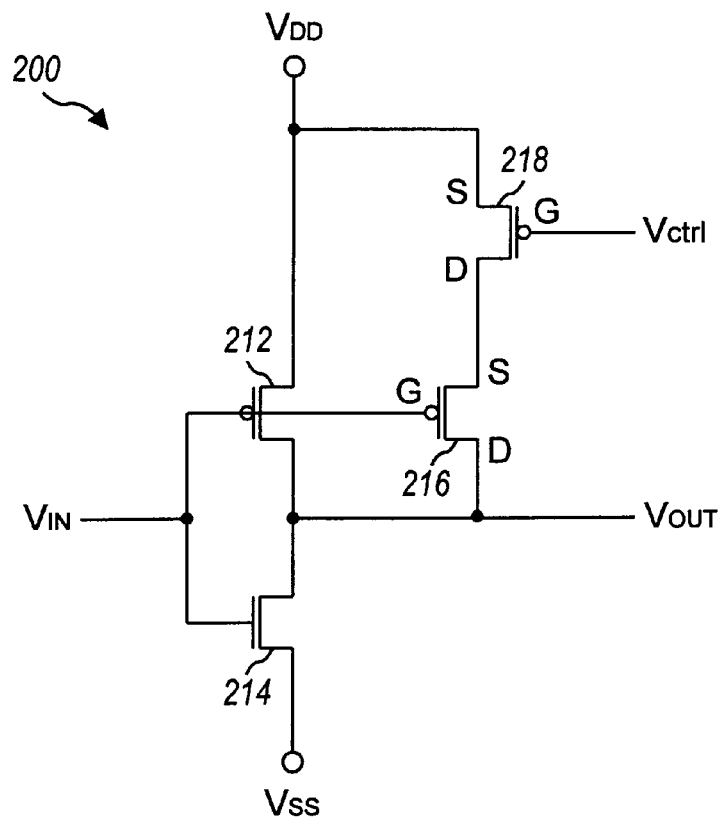
FIG. 2A is a simplified schematic diagram of one embodiment of the input buffer.

Referring to FIG. 2A, a simplified schematic of one embodiment of a CMOS inverting input buffer is shown.

Input buffer 200 includes a pair of input transistors 212 and 214 coupled in series and to the supply sources VDD and VSS, respectively. This configuration is similar to that shown in FIG. 1A (although the transistors can be of different sizes). However, this embodiment provides an additional P-channel input transistor 216 having its gate (G) and drain (D) coupled to the gate and drain, respectively, of transistor 212. The source of transistor 216 couples to the drain of a P-channel control transistor 218 and the source of the control transistor 218 couples to the supply source VDD.

Figure 1A:
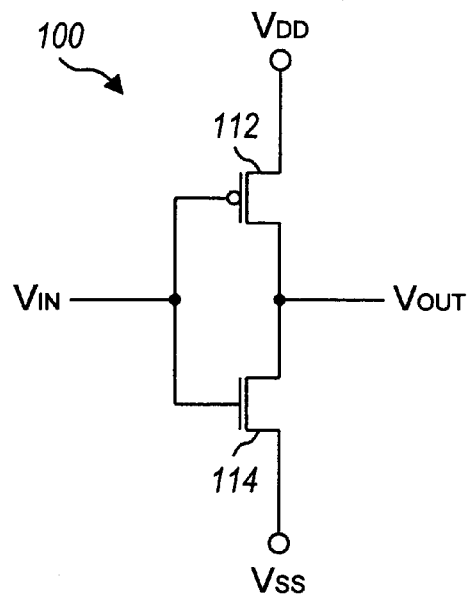
FIG. 1A is a simplified schematic diagram of a conventional CMOS inverting input buffer.

Transistor 214 performs the function of transistor 114 in FIG. 1A and transistors 212 and 216 perform the function of transistor 112. However, transistor 216 is selectively enabled, through a control signal Vctrl of the control transistor 218, to provide the desired circuit characteristics. The generation of the control signal Vctrl is described below.

Generally, the beta of the transistor determines its operating characteristics. Beta is related to the transistor size and bigger transistor size corresponds to higher beta. In accordance with the present invention, the beta of the input transistor is adjusted dynamically to adjust its operating characteristics to provide the desired performance.

Transistor 216, when enable, operates in parallel with transistor 212 and provides a larger composite P-channel transistor size, thereby resulting in a higher beta and correspondingly higher $V_{IH}$ and $V_{IL}$ trip points. When transistor 216 is disabled, only transistor 212 is operational and provides a smaller P-channel transistor size, thereby resulting in a lower beta and correspondingly lower $V_{IH}$ and $V_{IL}$ trip points. By properly allocating the sizes of P-channel transistors 212 and 216, the $V_{IH}$ and $V_{IL}$ trip points can be set independently of each other to provide many advantages.

With transistor 216 disabled, the P-channel transistor 212 and the N-channel transistor 214 provide the $V_{IH1}$ and $V_{IL1}$ trip points. With transistor 216 enabled, the P-channel transistors 212 and 216 and the N-channel transistor 214 provide the $V_{IH2}$ and $V_{IL2}$ trip points. Generally, $V_{IH2}$ is greater than $V_{IH1}$ and $V_{IL2}$ is greater than $V_{IL1}$.

In one aspect of the present invention, the $V_{IL}$ trip point is set higher than that of the conventional CMOS input buffer (e.g., input buffer 100), for a given $V_{IH}$. The desired $V_{IH}$, or $V_{IH1}$ using the nomenclature from above, is first set by selecting the proper sizes for the P-channel transistor 212 and the N-channel transistor 214 (ignoring transistor 216 for the moment). The desired $V_{IL}$, or $V_{IL2}$ using the above nomenclature, is then set by selecting the proper size for the P-channel transistor 216 such that overall size of the P-channel transistors 212 and 216 and the size of the N-channel transistor 214 provide the desired $V_{IL}$.

Figure 2B:
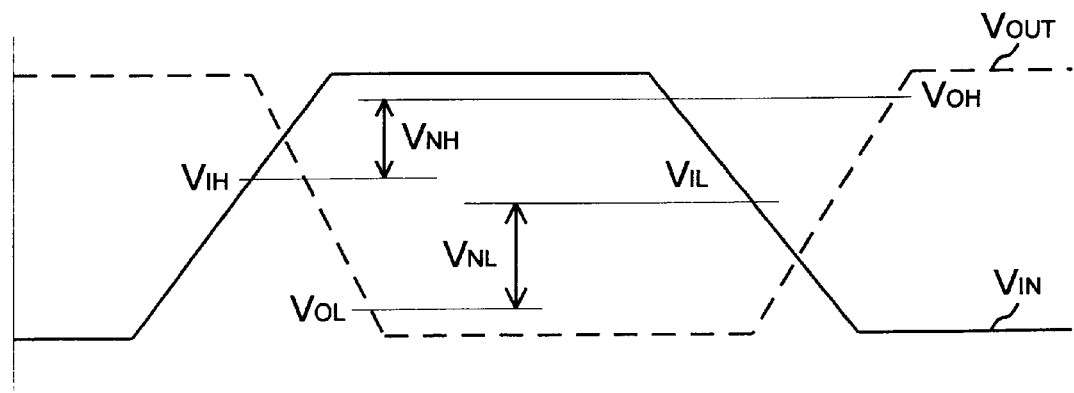
FIG. 2B is a diagram showing the DC specifications and noise margin for the input buffer.

In operation, the higher $V_{IL}$ is achieved by enabling transistor 216 before a logic high to low (falling) transition at the input ($V_{IHL}$) and disabling transistor 216 before a logic low to high (rising) transition ($V_{ILH}$). This is shown in FIG. 2B. Before the falling transition, control transistor 218 is turned on by bringing the control signal Vctrl low. Transistor 216 is now enabled and operates in parallel with transistor 212 to providing a larger transistor size, resulting in a desired (and higher) $V_{IL2}$ trip point during the falling transition. Similarly, before the rising transition, control transistor 218 is turned off by bringing the control signal Vctrl high. Transistor 216 is now disabled and transistor 212 provides a smaller P-channel transistor size, resulting in the desired (and lower) $V_{IH1}$ trip point during the rising transition. The additional input transistor 216 is enabled or disabled (and settled) before the transition at the input.

In FIG. 2A, the P-channel transistor 216 is shown with its source coupled to the control transistor 218. This topology is advantageous over the topology wherein the control transistor 218 is interposed between the drain of transistor 216 and the buffer output Vout. For improved high frequency AC performance it is preferable to couple the "static" transistor to the supply source. The control transistor 218 is switched and settled (i.e., "static") before the input transistor 216 is switched.

In one design of the input buffer 100 (see FIG. 1), the size of the P-channel transistor 112 is 12/2 and the size of the N-channel transistor is 70/2. The number in the numerator denotes the channel width, the number in the denominator denotes the channel length and the units are in micro-meter (micron). For the same input trip points for the input buffer 200 (see FIG. 2), the size of the P-channel transistor 212 can be 6/2, the N-channel transistor 214 can be 35/2 and the P-channel transistor 216 can be 6/2. By maintaining the approximately the same transistor size ratio (12/70 versus 6/35), the trip point $V_{IH}$ for a rising transition $V_{ILH}$ is approximately the same. However, the trip point $V_{IL}$ for a falling transition $V_{IHL}$ is increased because the transistor size ratios has increase from 12/70 to 12/35.

The ability to dynamically adjust the betas of the input transistors provides many benefits.

Figure 1B:
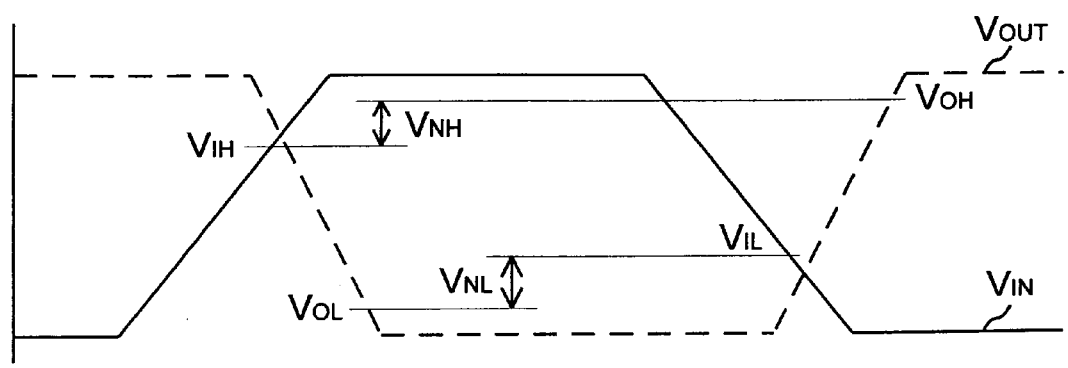
FIG. 1B is a diagram showing the DC specifications and noise margin of the input buffer.

First, the $V_{IH}$ and $V_{IL}$ can be set to provide improved manufacturing yield of these DC input specifications. Referring to FIG. 1B, the $V_{IH}$ and $V_{IL}$ trip points of the conventional input buffer 100 are usually "ganged" together such that setting the $V_{IH}$ for optimal performance (or manufacturing yield) usually results in a sub-optimal $V_{IL}$. A tradeoff is then made in the setting of the $V_{IH}$ and $V_{IL}$. The independent setting of the $V_{IH}$ and $V_{IL}$ trip points provided by the present invention allows both $V_{IH}$ and $V_{IL}$ to be set to their respective optimal voltages. Furthermore, the $V_{IL}$ of the conventional input buffer 100 can not generally be set higher than the $V_{IH}$. This limitation is overcome by the present invention such that $V_{IL}$ can be set independently (i.e., higher, lower, or the same) of the $V_{IH}$.

A diagram illustrating the DC specifications is shown in FIG. 1B wherein the input signal Vin is represented by the solid line and the output signal Vout is represented by the dashed line. As the input signal Vin crosses $V_{IH}$ during a transition from the logic low to high (rising transition), the output signal Vout changes state to a logic low. Similarly, as the input signal Vin crosses $V_{IL}$ during a transition from the logic high to low (falling transition), the output signal Vout also changes state to a logic high.

The DC input specifications (e.g., the $V_{IH}$ and $V_{IL}$ trip points) of the input buffer is dependent on the design of the input transistors. The transistor design must also take into account other considerations, such as the rise and fall time, the switching current, the operating speed, etc. Generally, the circuit designer selects the betas of the P-channel and the N-channel transistors, and the ratio of the transistor betas, such that the most favorable characteristics are obtained (e.g., fast transitions, required input trip points, etc.). The betas can be controlled by proper sizing of the transistors. Specifically, beta is proportional to the ratio of the channel width over the channel length, or β W/L, and the ratio of the betas ($\beta_P/\beta_N$) determines the trip points Traditionally, once the transistor betas are selected, the DC input specifications cannot be changed. The transistor betas are usually selected, in part, to provide the desired $V_{IH}$ trip point. Referring the input buffer 100 in FIG. 1A, the larger the beta of the N-channel transistor 114, the lower the threshold voltage of the transistor 114, and the lower the $V_{IH}$ trip point. Similarly, the smaller the beta of the P-channel transistor 112, the higher the threshold voltage of the transistor 112, and the lower the $V_{IH}$ trip point. Because of the structure of the input buffer 100, the $V_{IL}$ is also fixed by the selected transistor betas. In most conventional input buffer, $V_{IL}$ is a lower voltage than $V_{IH}$, as shown in FIG. 1B. Modification of the transistor betas to adjust $V_{IL}$ also results in a (usually undesirable) change to $V_{IH}$. The inability to independently set the $V_{IH}$ and $V_{IL}$ trip points results in a sub-optimal design that effects the performance of the input buffer 100 as well as the manufacturing yield.

Second, the output rise time is faster because the P-channel transistors 212 and 216 (size 12/2 in the above example) are sized to pull proportionally less current in the N-channel transistor 214 (size 35/2 in the above example) then the conventional input buffer having a P-channel size of 12/2 and an N-channel size of 70/2. The $V_{IL}$ level is not affected because the N-channel transistor 214 (size 35/2) is pulling proportionally the same amount of current in the P-channel transistor 212 (size 6/2). However, by decreasing the size of P-channel transistor 212 relative the overall size of the P-channel transistors 212 and 216, faster output rise time can be obtained while reducing the amount of cross current. For example, if transistors 212, 216, and 214 are sized 4/2, 8/2, and 35/2, respectively, the output rise time is faster (12/2 pulling against 35/2) then the conventional input buffer.

Third, the propagation delay of the input buffer 200 can be shortened by setting the $V_{IH}$ and $V_{IL}$ trip points such that the output switches earlier. Comparing FIG. 2B to FIG. 1B, it is shown that the output signal Vout switches earlier when the $V_{IH}$ is decreased and the $V_{IL}$ is increased.

Fourth, the $V_{IH}$ and $V_{IL}$ can be set to provide the desired noise margins. The noise margin of a logic circuit is the difference between the guaranteed logic high (or low) output voltage and the guaranteed logic high (or low) input voltage. The logic high noise margin $V_{NH}=V_{OH}-V_{IH}$ and the logic low noise margin $V_{NL}=V_{OL}-V_{IL}$. The noise margin defines the amount of noise that the circuit can tolerate and still maintain correct logic operation. For CMOS circuits, the $V_{OH}$ and $V_{OL}$ are typically specified to be within few tenths of a volt from the supply sources VDD and VSS, respectively. Thus, the noise margin is directly dependent on the $V_{IH}$ and $V_{IL}$ trip points. Preferably, the noise margin for a logic high should be approximately equivalent to the noise margin for a logic low such that the circuit is able to tolerate an equivalent amount of noise from both supplies.

For the input buffer 100 shown in FIG. 1A, the noise margins $V_{NH}$ and $V_{NL}$ are shown in FIG. 1B. The noise margins $V_{NH}$ and $V_{NL}$ for the input buffer 200 is shown in FIG. 2B. It can be noted that the independent setting of $V_{IH}$ and $V_{IL}$ results in improved noise margins when compared to that of the input buffer 100 as shown in FIG. 1B.

Fifth, the $V_{IH}$ and $V_{IL}$ can be set to provide the improved noise immunity. The noise immunity of a logic circuit is the voltage which, when applied to the input signal, causes the output to change its logic state. The noise immunity is an indication of the ability of the circuit to prevent noise on its input from being transferred to its output. The noise immunity is determined by the $V_{IH}$ and $V_{IL}$ trip points. As shown in FIG. 2B, the ability to set $V_{IL}$ close to the center voltage provides noise immunity approaching 50% of full scale voltage.

Sixth, the crossing current can be reduced during transitions which results in less switching noise in the input buffer 200. The P-channel transistor 212 and the N-channel transistor 214 have complementary characteristics (i.e., output current $I_{DS}$ versus input voltage $V_{GS}$ transfer curves are complementary for the P-channel and N-channel transistors) such that only one transistor is typically turned on at any given moment. During the transition between logic levels, both transistors can conduct simultaneously as the input signal passes through a transition region.

Cross current is the current flowing across the P-channel and N-channel input transistors during the transition region where both transistors conduct. For enhancement mode transistor, if the input voltage $V_{GS}$ is greater than the threshold voltage $V_{TH}$ of the transistor, the transistor is turned on and operates as a current source. If VDD–VSS is greater than the threshold voltages of the P-channel and N-channel transistors, then both transistors simultaneously conduct during a portion of the transition region. For example, if VDD=5.0 V, VSS is ground, and the threshold voltages of the P-channel and N-channel transistors are –1.0 V and 1.0 V, respectively, then both transistors conduct when the input voltage is between 1.0 V and 4.0 V. The amount of current flowing across both transistors depends on the sizes of the transistors. The larger the transistor size, the higher the on (and cross) current.

Less switching noise results in a lower probability of false sensing in the circuit wherein the input buffer 200 resides. The amount of cross current can be control by adjusting the transistor sizes. Generally, the larger the transistor size, the higher the switching current during a transition. By disabling P-channel transistor 216 before the rising transition $V_{ILH}$, the cross current is reduced.

Figure 3:
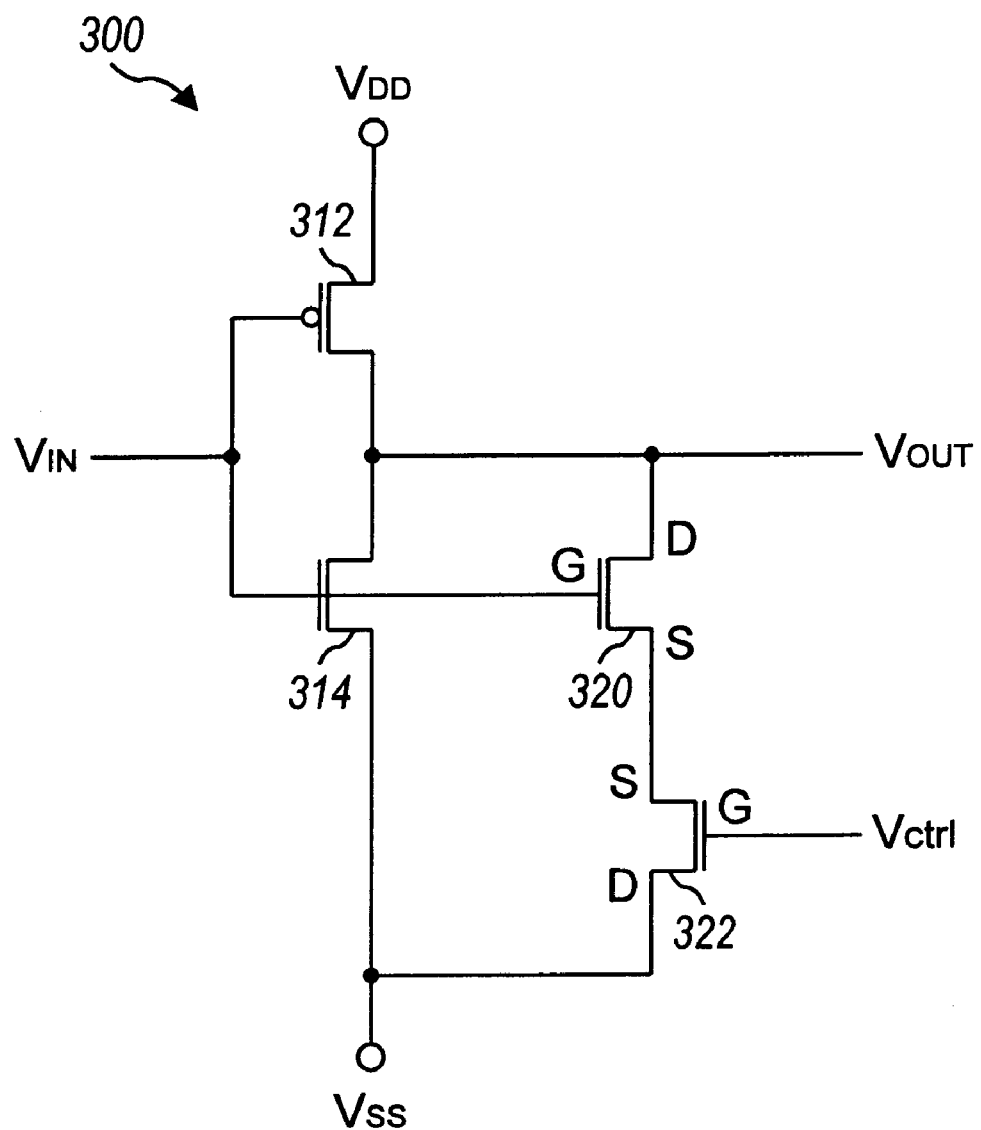
FIG. 3 is a simplified schematic diagram of another embodiment of the input buffer.

A simplified schematic of another embodiment of a CMOS inverting input buffer 300 is shown in FIG. 3. Input buffer 300 includes a pair of input transistors 312 and 314 coupled in series and to the supply sources VDD and VSS, respectively. This configuration is similar to that shown in FIGS. 1A and 2A. However, this embodiment provides an additional N-channel input transistor 320 having its gate (G) and drain (D) coupled to the gate and drain, respectively, of transistor 314. The source of transistor 320 couples to the drain of an N-channel control transistor 322 and the source of the control transistor 322 couples to the supply source VSS.

Transistor 312 performs the function of transistor 112 in FIG. 1A and transistors 314 and 320 perform the function of transistor 114. However, transistor 320 is selectively enabled, through a control signal Vctrl coupled to the gate of the control transistor 322, to provide the desired circuit characteristics.

Transistor 320, when enable, operates in parallel with transistor 314 and provides a larger composite N-channel transistor size, thereby resulting in lower $V_{IH}$ and $V_{IL}$ trip points. When transistor 320 is disabled, only transistor 314 is operational and provides a smaller N-channel transistor size, thereby resulting in higher $V_{IH}$ and $V_{IL}$ trip points. By properly allocating the sizes of N-channel transistors 314 and 320, the $V_{IH}$ and $V_{IL}$ trip points can be set independently of each other to provide many advantages.

With transistor 320 disabled, the P-channel transistor 312 and the N-channel transistor 314 provide the $V_{IH1}$ and $V_{IL1}$ trip points. With transistor 320 enabled, the P-channel transistor 312 and the N-channel transistors 314 and 320 provide the $V_{IH2}$ and $V_{IL2}$ trip points. Generally, $V_{IH2}$ is less than $V_{IH1}$ and $V_{IL2}$ is less than $V_{IL1}$.

To set the $V_{IL}$ trip point higher than that of the conventional CMOS input buffer (e.g., input buffer 100), for a given $V_{IH}$, the following procedure is applied. The desired $V_{IL}$, or $V_{IL1}$ using the nomenclature from above, is first set by selecting the proper sizes for the P-channel transistor 312 and the N-channel transistor 314 (ignoring transistor 320 for the moment). The desired $V_{IH}$, or $V_{IH2}$ using the above nomenclature, is then set by selecting the proper size for the N-channel transistor 320 such that the size of the P-channel transistor 312 and the overall size of the N-channel transistors 314 and 320 provide the desired $V_{IH}$.

In operation, the higher $V_{IL}$ is achieved by disabling transistor 320 before a logic high to low (falling) transition at the input ($V_{IHL}$) and enabling transistor 320 before a logic low to high (rising) transition ($V_{ILH}$). Before the rising transition, the control transistor 322 is turned on by bringing the control signal Vctrl high. Transistor 320 is now enabled and operates in parallel with transistor 314 to provide a larger N-channel transistor size, resulting in the desired (and lower) $V_{IH2}$ trip point during the rising transition. Similarly, before the falling transition, the control transistor 322 is turned off by bringing the control signal Vctrl low. Transistor 320 is now disabled and provides a smaller N-channel transistor size, resulting in the desired (and higher) $V_{IL1}$ trip point during the falling transition.

Figure 4:
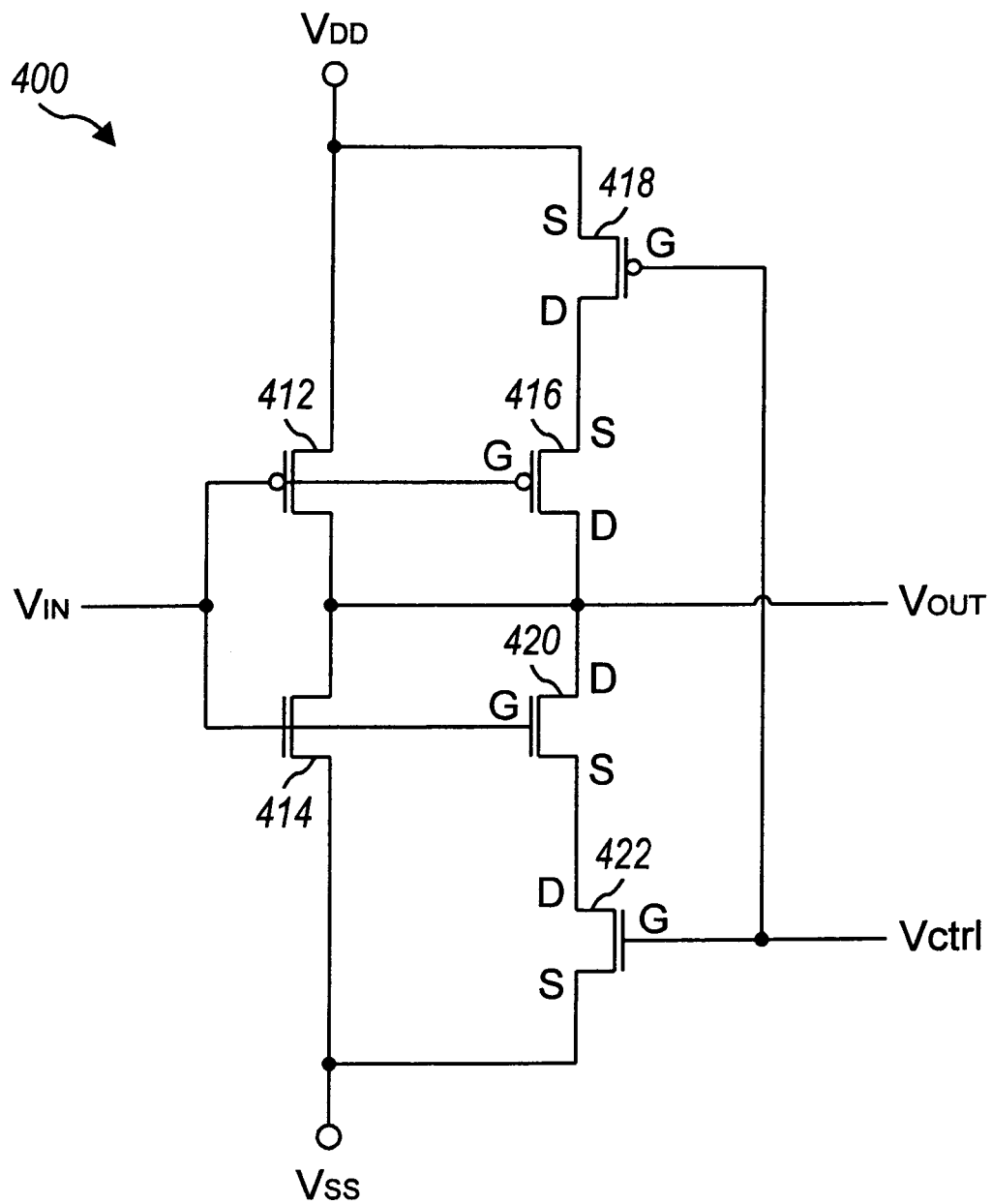
FIG. 4 is a simplified schematic diagram of yet another embodiment of the input buffer.

A simplified schematic of yet another embodiment of a CMOS inverting input buffer 400 is shown in FIG. 4. The input buffer 400 provides two additional input transistors 416 and 422 that are selectively enabled to provide additional flexibility in the design of the input buffer. Two additional input transistors provide further reduction in the amount of cross current and (possibly) faster switching time than a design utilizing one additional input transistor.

Input buffer 400 includes a pair of input transistors 412 and 414 coupled in series and to the supply sources VDD and VSS, respectively. This configuration is similar to that shown in FIG. 1A. However, this embodiment provides two additional input transistors, a P-channel transistor 416 having its gate (G) and drain (D) coupled respectively to the gate and drain of transistor 412 and an N-channel transistor 420 having its gate (G) and drain (D) coupled respectively to the gate and drain of transistor 414. The source of transistor 416 couples to the drain of a P-channel control transistor 418 and the source of the control transistor 418 couples to the supply source VDD. The source of transistor 420 couples to the drain of an N-channel control transistor 422 and the source of the control transistor 422 couples to the supply source VSS. The gates of the control transistors 418 and 422 couple together and to the control signal Vctrl.

Transistors 416 and 420 can be selectively enabled, through the control signal Vctrl, to provide the desired circuit characteristics. Transistor 416, when enabled, operates in parallel with transistor 412 and provides a larger composite P-channel transistor size, thereby resulting in higher $V_{IH}$ and $V_{IL}$ trip points. Transistor 420, when enabled, operates in parallel with transistor 414 and provides a larger composite N-channel transistor size, thereby resulting in lower $V_{IH}$ and $V_{IL}$ trip points. Only transistor 416 or transistor 420 is enabled at any given moment.

When the control signal Vctrl is low, the control transistor 418 is turned on thereby enabling transistor 416 and the control transistor 422 is turned off thereby disabling transistor 420. The composite size of the P-channel transistors 412 and 416 and the size of the N-channel transistor 414 provide high $V_{IH}$ and $V_{IL}$ trip points. Alternatively, when the control signal Vctrl is high, the control transistor 418 is turned off thereby disabling transistor 416 and the control transistor 422 is turned on thereby enabling transistor 420. The size of the P-channel transistor 412 and the composite size of the N-channel transistors 414 and 420 provide low $V_{IH}$ and $V_{IL}$ trip points.

To achieve higher $V_{IL}$ trip point than that of the input buffer 100, for the same $V_{IH}$ trip point, transistor 416 is enabled and transistor 420 is disabled before an input falling transition $V_{IHL}$. Conversely, to achieve lower $V_{IH}$ trip point than that of the input buffer 100, for the same $V_{IL}$ trip point, transistor 416 is disabled and transistor 420 is enabled before an input rising transition $V_{ILH}$.

The input buffer 400 can also be operated to provide a lower $V_{ILH}$ and a higher $V_{ILH}$ than that of the input buffer 100. These DC input characteristics may be required, for example, to interface the input buffer 400 to another digital logic circuit having defined DC output specifications.

The input buffer 400 reduces cross current during both rising and falling transitions. In one implementation, the combined size of the P-channel transistors 412 and 416 is equal to or less than the size of the equivalent P-channel transistor 112 in FIG. 1A. Similarly, the combined size of the N-channel transistors 414 and 420 is equal to or less than the size of the equivalent N-channel transistor 114. In addition, the transistor sizes can be reduced because of the N-channel and P-channel transistors are each split up into two transistors. As discussed above, the amount of cross current is dependent on the sizes of the P-channel transistors and the N-channel transistors that are actually turned on. The larger transistor size corresponds to higher beta and greater on current.

For input buffer 400, since only either transistor 416 or 420 is enabled at any given moment, the cross current is reduced by the transistor that is disabled. For example, before the falling transition, transistor 416 is disabled and the cross current is limited by transistor 412, even though both N-channel transistors 414 and 420 are enabled. Similarly, before the rising transition, transistor 420 is disabled and the cross current is limited by transistor 414, even though both P-channel transistors 412 and 416 are enabled. Since transistors 412 and 414 are smaller sized than the corresponding transistor 112 and 114, the cross current of input buffer 400 is less than that of input buffer 100 during both rising and falling transitions while still providing independent setting of the $V_{IH}$ and $V_{IL}$ trip points. As an example, for a simplified design wherein the sizes of transistor 412 and 416 are each half that of transistor 112 and the sizes of transistors 414 and 422 are each half that of transistor 114, the cross current is reduced by half. The amount of cross current reduces linearly with the transistor size because current is proportional to beta and beta is proportional to transistor size (I $\beta$, and $\beta$ W/L) The sizes of the input transistors 412, 414, 416, and 420 can be selected in the manner described above.

Figure 5:
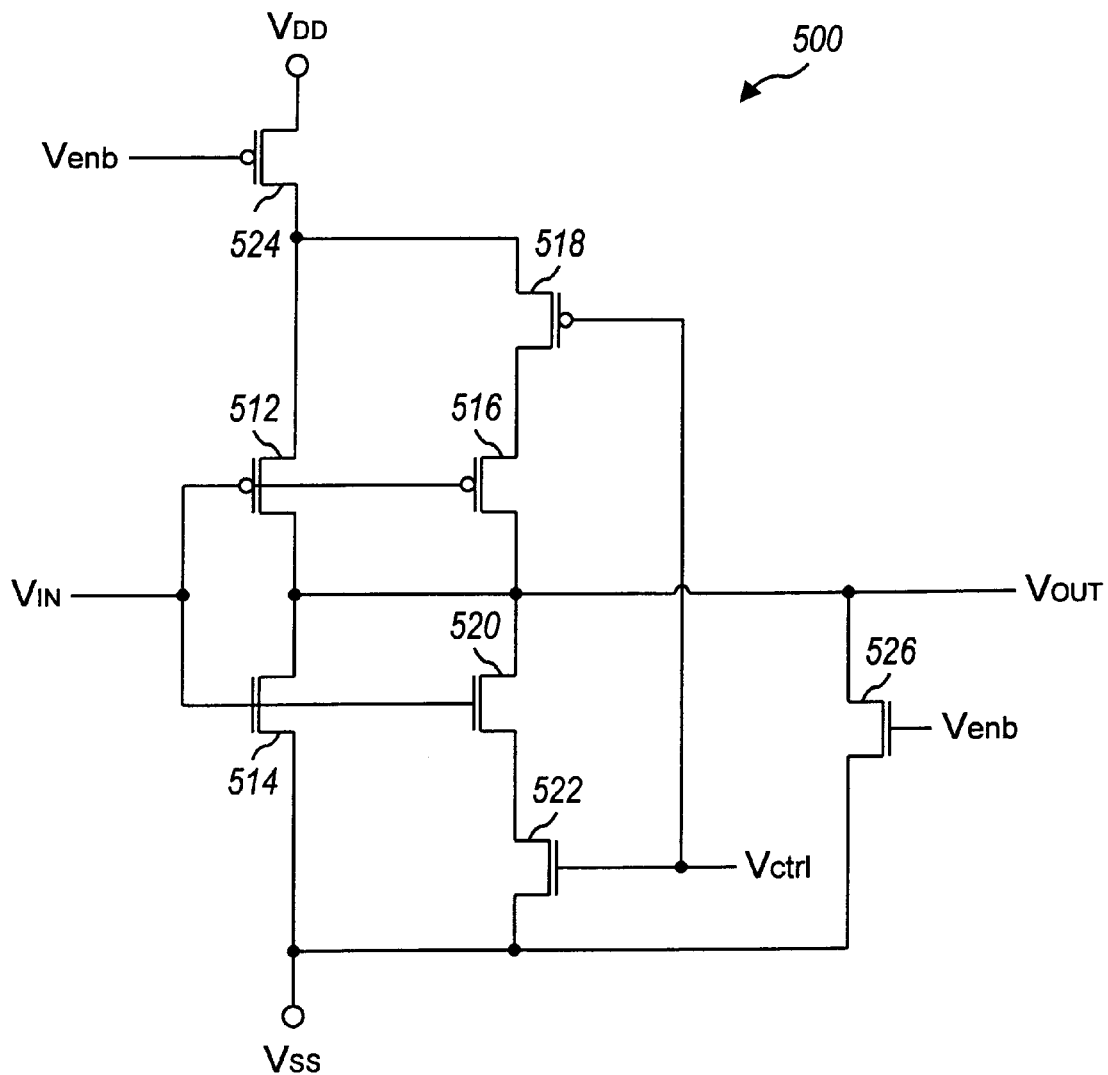
FIG. 5 is a simplified schematic diagram of still yet another embodiment of the input buffer.

For input buffer 400, the output rise time can be made faster because the P-channel transistors 412 and 416 are sized to pull proportionally less current in the N-channel transistor 414 then the conventional input buffer. Similarly, the output fall time can be made faster because the N-channel transistor 414 and 420 are sized to pull proportionally less current in the P-channel transistor 412. A simplified schematic of still yet another embodiment of a CMOS inverting input buffer 500 is shown in FIG. 5. The input buffer 500 is similar to the input buffer 400 shown in FIG. 4, with the addition of enable transistors 524 and 526.

Enable transistor 524 couples in series with transistors 512 and 514 and enable transistor couples in parallel with transistor 514. The input buffer 500 also includes two additional input transistors 516 and 520 and operates in the same manner as input buffer 400 when enabled.

Enable transistor 524 is a P-channel transistor that is used to enable and disable the input buffer 500. When the enable signal Venb is low, the transistor 524 is turned on and the transistor 526 is turned off. In this state, the input buffer 500 operates in the manner described above for the input buffer 400. When the enable signal Venb is high, transistor 524 is turned off and the transistor 526 is turned on. In this state, no current flows through the input transistors 512, 514, 516 and 520. The output voltage Vout would have floated in a high impedance state, except that transistor 526 is turned on and pulls the output voltage Vout low.

The enable circuit ensures that no (or low leakage) current flows through the input buffer 500 when it is disabled, even if the input is floating or changing. This reduces the amount of current consumption during a standby period and also prevents the input signal from propagating through the input buffer 500 to the output. The enable signal Venb can be couple to the chip enable signal.

CONTROL CIRCUIT

In accordance with the present invention, selected ones of the input transistors are enabled at specific input transitions. The enablement of the selected input transistors needs not be performed in a precise manner nor at a high switching rate. For CMOS circuits, once the signal reaches a steady state logic value, either the P-channel transistor or the complementary N-channel transistor is turned off. Thus, no current conducts upon reaching steady state.

In the present invention, the selected input transistors are enabled before the input transitions to which the transistors are to be applied.

Figure 6A:
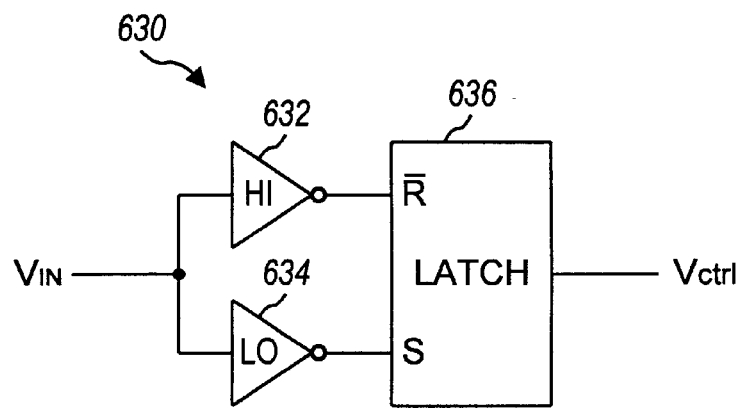
FIGS. 6A–6B are simplified schematic diagrams of two embodiments of the control circuit.

A simplified schematic diagram of one embodiment of a control circuit 630 for generating the control signal Vctrl is shown in FIG. 6A. The input signal Vin, the same signal that is applied to the input buffer, is provided to the input of inverters 632 and 634. The output of inverters 632 and 634 are provided to the R' and S inputs of latch 636, respectively, and the output of latch 636 comprises the control signal Vctrl.

Inverter 632 is designed to provide a high control trip point $V_{HI}$ for an input rising transition $V_{ILH}$. Inverter 634 is designed to provide a low control trip point $V_{LO}$ for an input falling transition $V_{IHL}$. Inverters 632 and 634 can be designed using the topology as shown in FIG. 1A. The $V_{HI}$ and $V_{LO}$ trip points of inverters 632 and 634 can be set by proper sizing of the P-channel and N-channel transistors, as described above. However, inverters 632 and 634 can be designed with smaller transistor sizes than that of the conventional inverter that is shown in FIG. 1A. The smaller transistor sizes results in less cross current. A slow response, resulting from the smaller transistor sizes, is desirable for the control circuit.

When the input signal Vin exceeds $V_{HI}$ during a rising transition, the output of inverter 632 transitions low (inverter 634 is already a logic low). A logic low at the R input resets latch 636 and the control signal Vctrl is high. When the input signal Vin falls below $V_{LO}$ during a falling transition, the output of inverter 634 transitions high (inverter 632 is already a logic high). A logic high at the S input sets latch 636 and the control signal Vctrl is low. The output of latch 636 is thus a delayed and inverted version of the input signal Vin.

Inverters 632 and 634 ensure that the control signal Vctrl does not change state during a transition at the input signal, to present oscillation and/or metastability of the input buffer. For example, a slow ramp at the input signal Vin can cause the additional input transistor to change state (enabled to disabled and vice versa), thereby changing the trip point that then can cause a change in state. Preferably, the $V_{HI}$ trip point is set higher than the $V_{IH}$ trip point of the input buffer to which the control signal Vctrl is applied. Similarly, the $V_{LO}$ trip point is set lower than the $V_{IL}$ trip point of the input buffer. These conditions ensure that the additional input transistor are not enabled nor disabled during the transitions at the input signal.

The operation of the control circuit 630 in combination with an input buffer can be described by reference to the embodiment shown in FIG. 2A. As described above, the P-channel transistor 216 is enabled before a falling transition $V_{IHL}$. Also, the control signal Vctrl is a delayed and inverted version of the input signal Vin. Thus, after the input signal Vin has transitioned from low to high, Vctrl is logic low and turns on the control transistor 218. Transistor 216 is now enabled and awaits the next falling transition $V_{IHL}$ to which it will operate. After the input signal Vin has transitioned from high to low, Vctrl is logic high and turns off the control transistor 218. Transistor 216 is now disabled and awaits the next rising transition $V_{ILH}$ at the input.

As described above, the additional input transistor is enabled or disabled shortly after the input signal has transitioned. Precise timing is not necessary. Care is used to ensure that the delay between Vctrl and Vin is shorter than the pulse width of the input signal so that the additional input transistor is properly enabled or disabled before the next transition arrives.

Figure 6B:
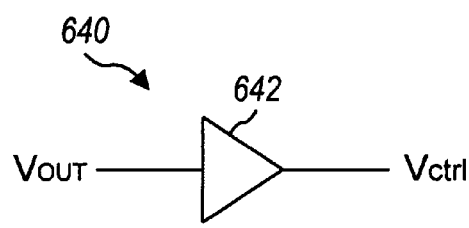
Figure 6C:
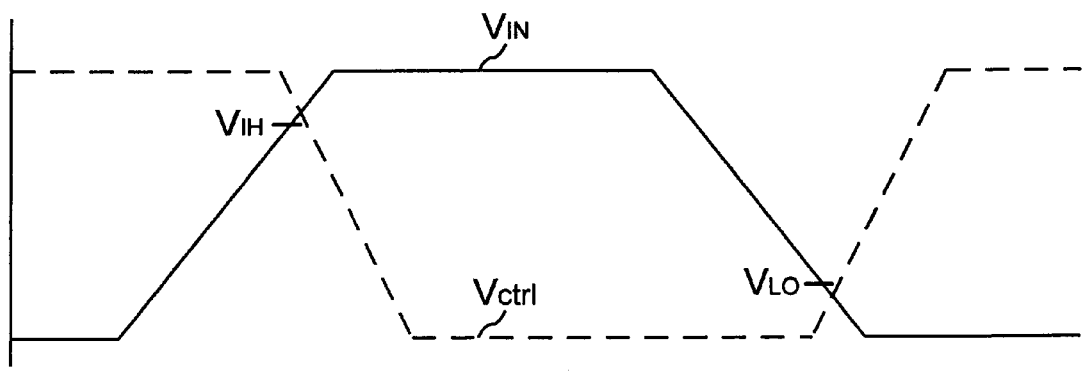
FIG. 6C is a timing diagram illustrating the operation of the control circuit of FIG. 6A.

A simplified schematic diagram of another embodiment of a control circuit 640 for generating the control signal Vctrl is shown in FIG. 6B. The output signal Vout, the same signal that is provided by the input buffer, is provided to input of buffer 642. The output of buffer 642 comprises the control signal Vctrl. Since the output signal Vout is already inverted with respect to the input signal, buffer 642 is non-inverting. As with control circuit 630, the control signal Vctrl generated by control circuit 640 is a delayed and inverted version of the input signal Vin.

Control circuit 640 uses the $V_{IH}$ and $V_{IL}$ trip points of the input buffer to generate the control signal Vctrl (through the use of the buffer output signal Vout). Thus, care is exercised in the design of control circuit 640 to ensure that oscillation or metastability problems do not occur. The input buffer of the present invention can be used in any digital logic circuits including microprocessors, controllers, digital signal processors, memory devices, etc. In particular, the input buffer is especially suited for used in memory devices including random access memory (RAM), read only memory (ROM), erasable programmable read only memory (EPROM), electronically erasable programmable read only memory (EEPROM), and FLASH EPROM.

For clarity, the invention has been described using CMOS logic. However, the inventive concept of dynamic adjustment of the beta of the input transistors to provide the desired operating characteristics can be applied to other logic families such as TTL, ECL, GaAs, etc. As used herein in its broadest scope, especially in the claims, "transistor" denotes an active device from any logic families, including bipolar junction transistor (BJT), field effect transistor (FET), gallium arsinide (GaAs) transistors, and the like.

The previous description of the specific embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. A logic input buffer for receiving an input signal, comprising:
   a P-channel input transistor;
   an N-channel input transistor coupled in series with the P-channel input transistor;
   an additional input transistor coupled in parallel with one of the input transistors;
   a control transistor coupled in series with the additional input transistor, and
   wherein the additional input transistor is dynamically enabled before selective ones of rising and falling transitions of the input signal and dynamically disabled before selective other ones of transitions of the input signal, and wherein the additional input transistor is enabled or disabled for the duration of the rising and falling transitions.

2. The buffer of claim 1 wherein the additional input transistor is a P-channel transistor that is coupled in parallel with the P-channel input transistor.

3. The buffer of claim 2 wherein the additional input transistor is enabled before a falling transition of the input signal.

4. The buffer of claim 2 wherein the additional input transistor is coupled to an output of the buffer.

5. The buffer of claim 1 wherein the additional input transistor is an N-channel transistor that is coupled in parallel with the N-channel input transistor.

6. The buffer of claim 5 wherein the additional input transistor is enabled before a rising transition of the input signal.

7. The buffer of claim 1 wherein transistor sizes of the P-channel input transistor, the N-channel input transistor, and the additional input transistor are selected based on required input trip points.

8. The buffer of claim 2 wherein a low input trip point $V_{IL}$ is adjusted to be higher than a high input trip point $V_{IH}$.

9. The buffer of claim 1 wherein transistor sizes of the P-channel input transistor, the N-channel input transistor, and the additional input transistor are selected based on specified amount of cross current during transitions at the input signal.

10. The buffer of claim 1 wherein transistor sizes of the P-channel input transistor, the N-channel input transistor, and the additional input transistor are selected based on required noise performance.

11. The buffer of claim 1 wherein a transistor size of the additional input transistor is similar to that of the input transistor to which it couples in parallel.

12. The buffer of claim 1 further comprising:
    a control circuit coupled to the control transistor.

13. A logic input buffer comprising:
    a P-channel input transistor;
    an N-channel input transistor coupled in series with the P-channel input transistor;
    an additional input transistor coupled in parallel with one of the input transistors and enabled before, and for the duration of, selective ones of rising and falling transitions of an input signal;
    a control transistor coupled in series with the additional input transistor; and
    a control circuit coupled to the control transistor and to the input signal.

14. A logic input buffer comprising:
    a P-channel input transistor;
    an N-channel input transistor coupled in series with the P-channel input transistor;
    an additional input transistor coupled in parallel with one of the input transistors and enabled before selective ones of rising and falling transitions of an input signal;
    a control transistor coupled in series with the additional input transistor; and
    a control circuit coupled to the control transistor and to the input signal, wherein the control circuit comprises
    a first inverter coupled to the input signal,
    a second inverter coupled to the input signal,
    a latch coupled to the first and second inverters, and
    wherein the latch couples to the control transistor.

15. The buffer of claim 12 wherein the control circuit further couples to an output of the buffer.

16. A logic input buffer comprising:
    a P-channel input transistor;
    an N-channel input transistor coupled in series with the P-channel input transistor;
    an additional input transistor coupled in parallel with one of the input transistors and enabled before, and for the duration of, selective ones of rising and falling transitions of an input signal;
    a control transistor coupled in series with the additional input transistor; and
    a control circuit coupled to the control transistor and comprising a delay element.

17. The buffer of claim 1 further comprising:
    a first enable transistor coupled in series with the input transistors.

18. The buffer of claim 17 further comprising:
    a second enable transistor coupled in parallel with the N-channel input transistor.

19. A logic input buffer comprising:
    a P-channel input transistor;
    an N-channel input transistor coupled in series with the P-channel input transistor;
    an additional P-channel input transistor coupled in parallel with the P-channel input transistor;
    an additional N-channel input transistor coupled in parallel with the N-channel input transistor;
    a first control transistor coupled in series with the additional P-channel input transistor;
    a second control transistor coupled in series with the additional N-channel input transistor, and
    wherein the additional input transistors are each dynamically enabled before, and for the duration of, selective ones of rising and falling transitions of an input signal.

20. The buffer of claim 19 wherein the additional P-channel input transistor is enabled before falling transitions of the input signal.

21. The buffer of claim 19 wherein the additional N-channel input transistor is enabled before rising transitions of the input signal.

22. The buffer of claim 19 further comprising:
    a control circuit coupled to the first and second control transistors.

23. A logic input buffer comprising:
    a first input transistor;
    a second input transistor coupled in series with the first input transistor;

a third input transistor coupled in parallel with one of the first and second input transistors; and a control circuit operatively coupled to the third transistor and the input signal, the control circuit providing a control signal that dynamically enables and disables the third input transistor based on, and for the duration of transitions of, the input signal.

24. The buffer of claim 23 further comprising:

a control transistor coupled to the third input transistor.

25. A method for independently controlling input trip points of a logic input buffer comprising:

receiving an input signal with the input buffer;

generating a control signal based, in part, on the input signal;

dynamically adjusting betas of selected ones of input transistors within the input buffer in accordance with the control signal, and wherein the betas are adjusted prior to, and for the duration of, transitions of the input signal.

26. The buffer of claim 13, wherein the additional input transistor is a P-channel transistor that is coupled in parallel with the P-channel input transistor.

27. The buffer of claim 13, wherein the additional input transistor is a N-channel transistor that is coupled in parallel with the N-channel input transistor.

28. The buffer of claim 13, further comprising:

a first enable transistor coupled in series with the N-channel and P-channel input transistors.

29. An integrated circuit comprising the buffer of claim 13.

30. A DRAM device comprising the buffer of claim 13.

31. A logic buffer configured to receive and buffer an input signal, the buffer comprising:

a first input transistor;

a second input transistor coupled in series with the first input transistor; and a third input transistor coupled in parallel with the first or second input transistors, wherein the third input transistor is dynamically enabled prior to, and for the duration of, transitions of the input signal to provide a particular circuit characteristic.

32. A buffer claim 31, wherein the third input transistor is enabled based, in part, on the input signal.

* * * * *